United States Patent [19]
Baker

[11] Patent Number: 5,701,073
[45] Date of Patent: Dec. 23, 1997

[54] DIRECT CURRENT MEASURING APPARATUS AND METHOD EMPLOYING FLUX DIVERSION

[75] Inventor: Clifford E. Baker, Hillsboro, Oreg.

[73] Assignee: Tektronix, Inc., Wilsonville, Oreg.

[21] Appl. No.: 608,239

[22] Filed: Feb. 28, 1996

[51] Int. Cl.⁶ .............................. G01R 15/06; G01R 1/30
[52] U.S. Cl. ........................................................ 324/117 H
[58] Field of Search ........................... 324/117 R, 117 H, 324/126, 127, 229, 230, 251, 252; 338/32 H; 336/175; 364/571.01

[56] References Cited

U.S. PATENT DOCUMENTS

| | | | |
|---|---|---|---|
| 3,475,682 | 10/1969 | Peek et al. | 324/127 |
| 3,525,041 | 8/1970 | Velsink | 324/117 |
| 3,706,032 | 12/1972 | Vikstrom | 324/127 |
| 4,005,380 | 1/1977 | Hellmann et al. | 324/127 |
| 4,639,665 | 1/1987 | Gary | 324/117 H |
| 4,771,238 | 9/1988 | Caruso et al. | 324/229 |
| 4,864,223 | 9/1989 | Joder et al. | 324/117 H |
| 4,901,008 | 2/1990 | Quastel et al. | 324/117 H |
| 4,939,448 | 7/1990 | Gudel | 324/117 H |
| 5,057,769 | 10/1991 | Edwards | 324/127 |
| 5,132,608 | 7/1992 | Nishifuji et al. | 324/99 R |
| 5,146,156 | 9/1992 | Marcel | 324/127 |
| 5,473,244 | 12/1995 | Libove et al. | 324/126 |

*Primary Examiner*—Vinh P. Nguyen
*Attorney, Agent, or Firm*—Richard B. Preiss; William K. Bucher

[57] ABSTRACT

A current probe (10) measures a signal current flowing in a conductor (12), which produces a signal flux (14) proportional to the signal current. The probe includes a pair of probe arms (16, 18) that straddle the conductor, a flux shunt (20), a pair of flux diverting arms (22, 24), and a flux link (26). A Hall-effect device (28) senses the amount of flux flowing in the flux shunt. A major portion of the signal flux flows in a preferential path (30) through the flux shunt while a minor portion flows in a flux diverting path (32). The ratio of the amount of the signal flux flowing in the preferential flux path to the diverting path depends on the reluctance in each path, which is determined by air gaps (27, 34). The Hall-effect device drives a current source (40) that provides a diverter current through a pair of flux diverting coils (42, 44) that are wound around flux diverting arms (22, 24) of the current probe. The diverter current produces in the flux diverting path a diverting flux (46) that diverts the signal flux from the flux shunt. The signal current is measured by determining the amount of diverter current required to completely divert the signal flux flowing in the flux shunt.

27 Claims, 2 Drawing Sheets

DIRECT CURRENT MEASURING APPARATUS AND METHOD EMPLOYING FLUX DIVERSION

TECHNICAL FIELD

This invention relates to electrical and electronic measurements and more particularly to a direct current ("DC") measuring probe employing flux diversion to measure a current flowing in an electrical conductor that is magnetically coupled to the probe.

BACKGROUND OF THE INVENTION

There are previously known apparatuses and methods for measuring a direct current flowing in an electrical conductor. Most commonly, the conductor is broken apart and an invasive current measuring device, such as an ammeter, is inserted in the break to perform the measurement. Often, a current sensing device, such as a resistor, is inserted in the break to develop a voltage that can be sensed by another measurement device, such as an oscilloscope. The latter invasive current measuring method is advantageous because it is capable of measuring not only direct current, but also alternating currents having a wide range of frequencies. However, breaking the conductor is not only inconvenient, but perturbs the operating characteristics of the circuit associated with the conductor, exposes the current measuring device and its user to potentially hazardous voltages, and often leads to inaccurate current measurements.

Therefore, noninvasive DC current probes have been developed that sense the magnetic flux surrounding the conductor to measure the current without breaking the conductor. One such probe employing a feedback system is described in U.S. Pat. No. 3,525,041 for MAGNETIC FIELD MEASURING METHOD AND DEVICE EFFECTIVE OVER A WIDE FREQUENCY RANGE and in U.S. Pat. No. 3,475,682 for SHIELDED CURRENT MEASURING DEVICE, both of which are assigned to the assignee of this application. The probe surrounds the conductor with a magnetic core and employs a Hall-effect device to sense the flux in the core. A coil wound on the core provides an opposing flux that is equal and opposite to the flux generated by the conductor. The current in the coil is adjusted to null the total flux in the core as sensed by the Hall-effect device. The current through the conductor is measured as a known proportion of the current in the coil.

Unfortunately, the probe is disadvantageous for measuring high conductor currents because the nulling current in the coil is proportionally high, causing high power consumption. The physical structure is also disadvantageous because the probe requires slipping a closable "jaw" over the conductor, which limits the probe's usefulness in tight locations, requires costly lapping of the jaw surfaces to provide a good magnetic connection, and exposes the uninsulated jaw surfaces, and thereby the rest of the probe, to potentially hazardous voltages.

What is needed, therefore, is a noninvasive current measuring apparatus and method that is usable in tight locations, has no uninsulated surfaces, and is capable of accurately measuring a wide range of currents over a wide range of frequencies.

SUMMARY OF THE INVENTION

An object of this invention is, therefore, to provide a noninvasive current measuring apparatus and method.

Another object of this invention is to provide a noninvasive current measuring apparatus and method for accurately measuring a wide range of currents over a wide range of frequencies.

A further object of this invention is to provide a noninvasive current measuring apparatus that is usable in tight locations.

Still another object of this invention is to provide a noninvasive current measuring apparatus that has no exposed uninsulated surfaces or exposed lapped surfaces.

A preferred embodiment of a current probe for measuring a signal current flowing in a conductor is formed from a ferrite material and includes a pair of probe arms that straddle the conductor, a flux shunt, a pair of flux diverting arms, and a flux link. The flux shunt includes an air gap into which is fitted a Hall-effect device that senses the amount of magnetic flux flowing in the flux shunt.

Because the probe arms and the flux shunt straddle and are closely coupled to the conductor, a major portion of the magnetic flux lines induced by the signal current flows in a preferential flux path from one probe arm, through the flux shunt and the air gap, and back through the other probe arm. A minor portion of the magnetic flux lines flows in a flux diverting path from one probe arm, bypassing the flux shunt, through one flux diverting arm, the flux link, the other flux diverting arm, and back through the other probe arm. The flux link is spaced apart from the flux diverting arms by a pair of air gaps. The ratio of the amount of magnetic flux lines flowing in the preferential flux path to those flowing in the flux diverting path is determined by the reluctance in each path, which is dominated by the relative widths of the air gaps in each path.

The Hall-effect device senses the amount of magnetic flux flowing in the flux shunt and generates a proportional electrical signal that is amplified to provide a proportional diverter current through a pair of flux diverting coils that are wound around the flux diverting arms. The flux diverting coils produce a diverting flux in the flux diverting path having a flux density proportional to the diverter current. The diverting flux generates a magneto motive force in the flux diverting path that diverts magnetic flux from the preferential flux path into the flux diverting path.

The signal current is measured by measuring the amount of diverter current necessary to null out or divert all of the magnetic flux flowing in the flux shunt. The proportion of signal current to diverter current is a function of the ratio of the reluctances in the preferential flux path to the flux diverting path, the number of turns on the flux diverting coils, and the amount of coupling between the conductor and the probe arms.

If the signal current includes a high-frequency component, the Hall-effect device and the flux diverting coils cannot accurately measure the high-frequency component because they have limited bandwidth. Therefore, a pair of high-frequency coils are wound around the probe arms to improve the high-frequency current measuring capability of the current probe by coupling a portion of the high-frequency component into the output signal generated by the current probe.

An advantage of the current probe of this invention is that less power is required than in prior current probes. This is because the diverter coil simply diverts flux rather than reducing it to zero. Flux diversion is especially advantageous for measuring high currents because the resulting low-power consumption allows the current measuring circuit to be mounted in the probe assembly, thereby improving high-frequency response.

Another advantage of this invention is that the probe may simply be slipped over a conductor without any need to close a mechanically complex jaw. This simplifies the invention and facilitates making a probe that is usable in very tight locations.

Yet another advantage of this invention is that all of the magnetic material in the probe can be covered with an insulating material, thereby reducing electrical shock hazards to the probe and its user.

A further advantage of this invention is that very few magnetic surfaces require lapping, which reduces manufacturing cost. Moreover, the remaining lapped surfaces are unexposed and are, therefore, not subject to damage.

Yet a further advantage of this invention is that the insertion impedance is very low, especially the inductive component, which allows accurate noninvasive measurements of high DC currents having high-frequency components.

Additional objects and advantages of this invention will be apparent from the following detailed description of a preferred embodiment thereof that proceeds with reference to the accompanying drawings.

BRIEF DESCRIPTION OF THE DRAWINGS

FIG. 3 is a pictorial top view of the current measuring probe sectionally cut away to reveal a preferred arrangement of flux carrying components, a Hall-effect device, flux diverter coils, high-frequency coils, magnetic shielding, and an insulating covering of this invention.

DETAILED DESCRIPTION OF A PREFERRED EMBODIMENT

Figure 1:
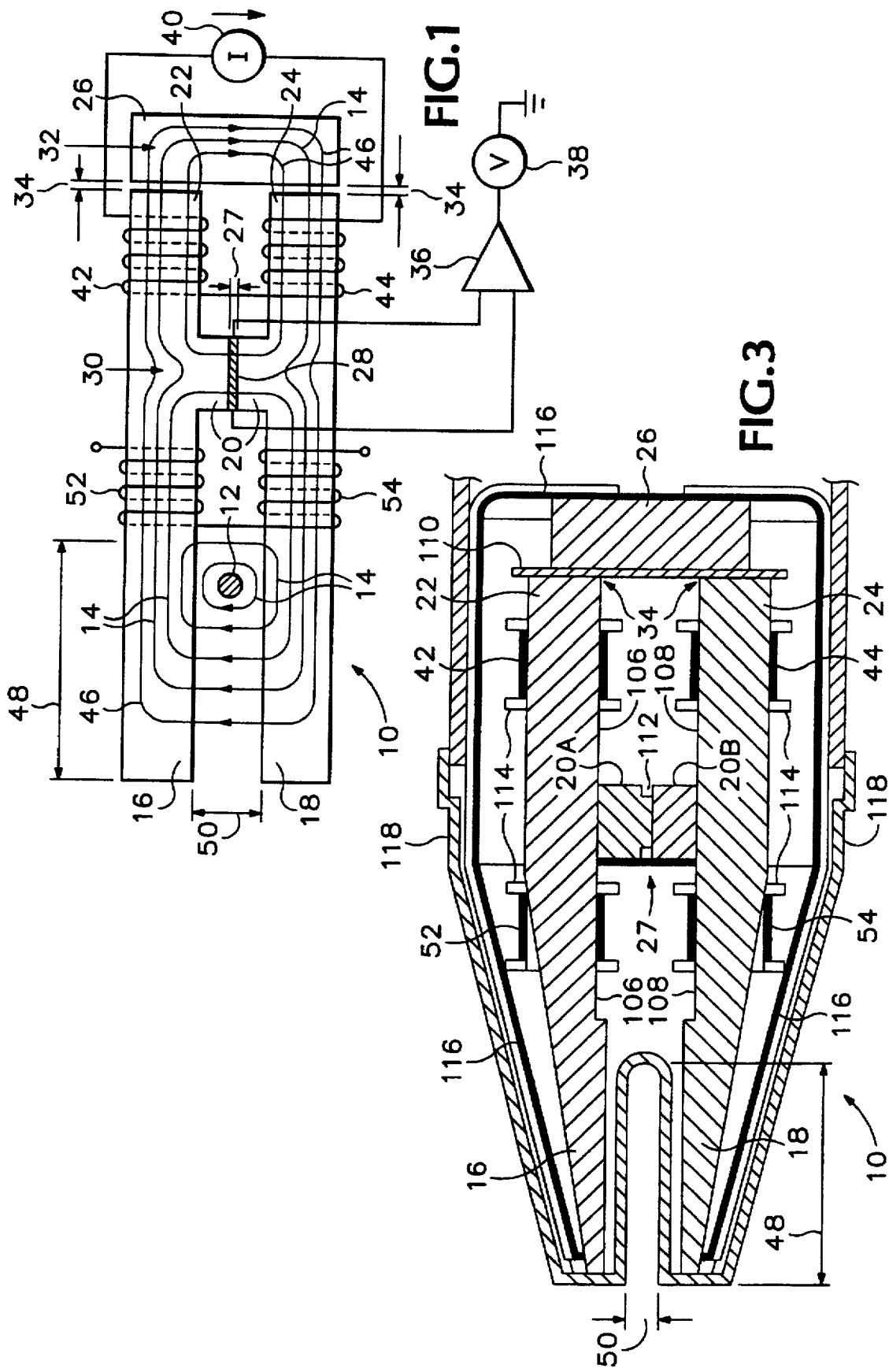
FIG. 1 is a pictorial schematic diagram showing preferential and diverted magnetic flux paths in a current measuring probe of this invention.

FIG. 1 shows a current probe 10 for measuring a signal current flowing in a conductor 12 (shown in cross-section), which produces magnetic flux lines 14 proportional to the signal current. Current probe 10 is formed from a high-permeability ferrite material and includes a pair of probe arms 16 and 18 that straddle conductor 12, a flux shunt 20, a pair of flux diverting arms 22 and 24, and a flux link 26. Flux shunt 20 includes an air gap 27 that encloses a Hall-effect device 28 (shown in cross-hatching) that senses the amount of magnetic flux flowing in flux shunt 20. Hall-effect device 28 is preferably deposited on one of the faces of flux shunt 20 that form air gap 27 by employing well-known thin-film deposition processes. Alternatively, Hall-effect device 28 may be sliced from a Hall-device crystal or be a commercially available unencapsulated die so that air gap 27 will not exceed about 0.25 millimeter (0.01 inch) in width. The material forming current probe 10 is preferably a well-known high-frequency, low-loss type MN60 ferrite having a permeability of at least 3,000. A power type ferrite, similar to ceramic magnetic MN60, is commercially available from various manufacturers.

Because probe arms 16 and 18 and flux shunt 20 straddle and are closely coupled to conductor 12, a major portion of magnetic flux lines 14 flows in a preferential flux path 30 from probe arm 16, through flux shunt 20 and air gap 27, and back through probe arm 18. A minor portion of magnetic flux lines 14 flows in a flux diverting path 32 from probe arm 16, bypassing flux shunt 20, through flux diverting arm 22, flux link 26, flux diverting arm 24, and back through probe arm 18. Flux link 26 is spaced apart from flux diverting arms 22 and 24 by air gaps 34.

The ratio of the amount of magnetic flux lines 14 flowing in preferential flux path 30 to flux diverting path 32 is determined by the reluctance in each path, which is dominated by the relative widths of air gap 27 and air gaps 34. Preferably, the ratio of the air gap widths is about 1:15 with air gap 27 having the smaller width and, therefore, the smaller reluctance. In the preferred thin-film embodiment of Hall-effect device 28, air gap 27 is about 0.0075 millimeter (0.0003 inch) in width and air gap 34 is about 0.25 millimeter (0.01 inch) in width.

Hall-effect device 28, in air gap 27, senses the amount of magnetic flux flowing in flux shunt 20 and generates a proportional electrical signal that is received by an amplifier 36, which drives a null-indicating device 38, such as a voltmeter.

A current source 40 provides a predetermined amount of diverter current through a pair of flux diverting coils 42 and 44 that are wound around respective flux diverting arms 22 and 24 of current probe 10. The diverter current flowing in flux diverting coils 42 and 44 produces a magneto motive force proportional to the diverter current. This magneto motive force is in such a direction as to divert the magnetic flux lines 14 from the preferential flux path 30 into flux diverting path 32, shown as flux lines 46.

The signal current is measured by adjusting current source 40 until the predetermined amount of diverter current causes null-indicating device 38 to indicate zero. The predetermined amount of diverter current necessary to null out, or divert, all of magnetic flux lines 14 and 46 flowing in flux shunt 20 is directly proportional to the signal current, which is thereby measurable. The actual proportion of signal current to diverter current is a function of the ratio of reluctances in preferential flux path 30 and flux diverting path 32 (preferably 1:15), the number of turns on flux diverting coils 42 and 44 (preferably 250 turns each), and the amount of coupling between conductor 12 and probe arms 16 and 18. To ensure sufficient coupling, probe arms 16 and 18 have a length 48 and a gap 50 proportioned in a preferred 6:1 ratio. The coupling is also a function of the distance into gap 50 that conductor 12 protrudes, with FIG. 1 showing conductor 12 protruding about 80 percent of the distance into gap 50. In practice, the amount of coupling increases nonlinearly until conductor 12 penetrates about 90 percent of the distance into gap 50, after which the amount of coupling remains substantially constant.

If the signal current includes a high-frequency component, Hall-effect device 28 and the flux diverting coil apparatus of FIG. 1 cannot accurately measure the high-frequency component because they have limited bandwidth. Therefore, a pair of high-frequency coils 52 and 54 (preferably 25 turns each) are wound around respective probe arms 16 and 18 to improve the high-frequency current measuring capability of current probe 10.

Figure 2:
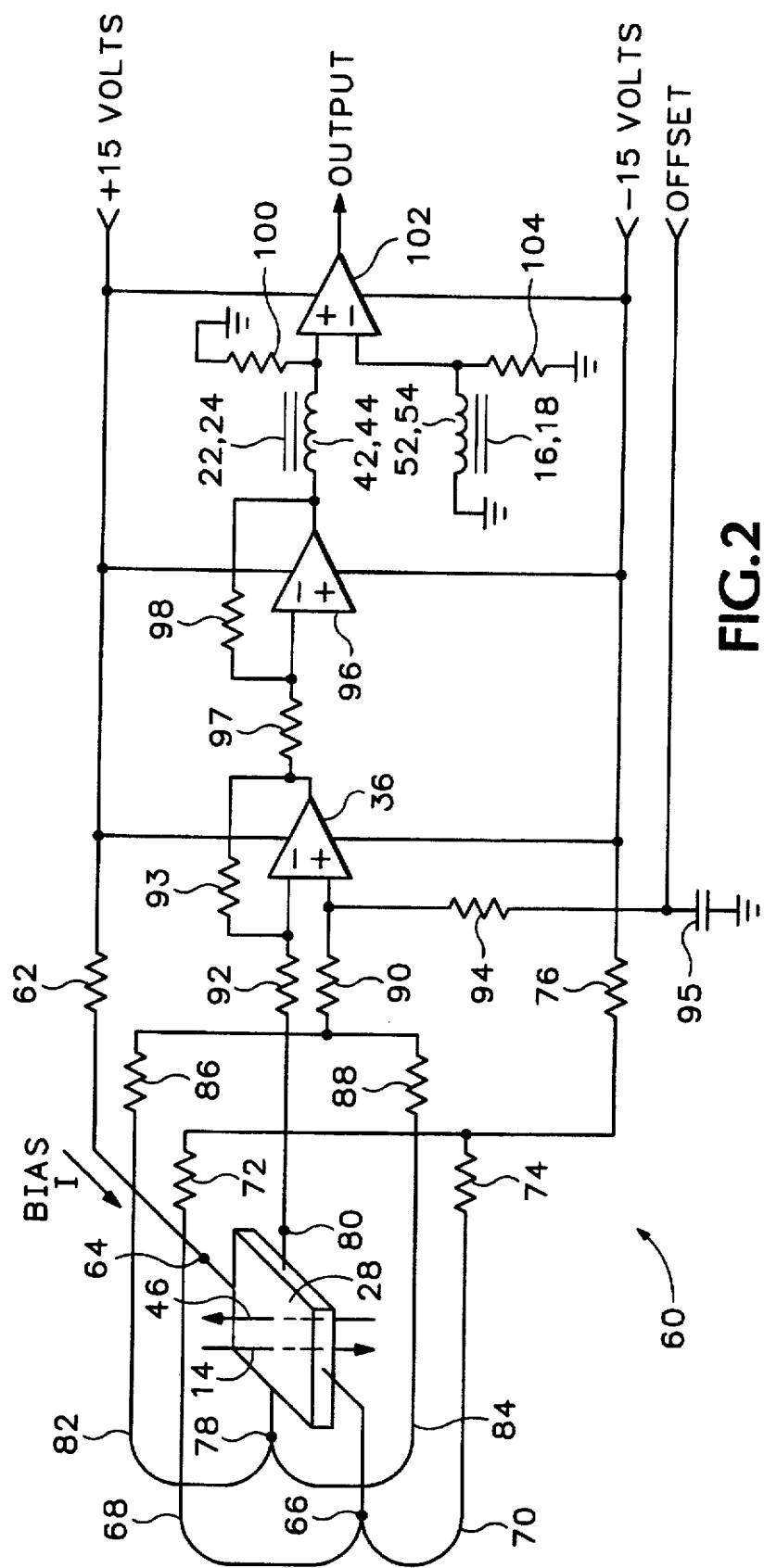
FIG. 2 is an electrical schematic circuit diagram of the current measuring probe of this invention.

FIG. 2 shows a preferred current measuring circuit 60 suitable for use with current probe 10 to measure in conductor 12 signal currents having a wide range of DC and high-frequency components. A Hall-effect bias current flows from a +15 volt source, through a 1,000 ohm resistor 62, into terminal 64 of Hall-effect device 28, and out terminal 66 of Hall-effect device 28. The bias current divides at terminal 66 into a clockwise-routed half-turn conductor 68 and a counter-clockwise-routed half-turn conductor 70 and into respective 10 ohm resistors 72 and 74. The divided bias current flows out of and is recombined at the interconnection of resistors 72 and 74, from which the bias current flows through a 1,000 ohm resistor 76 to a −15 volt source. Clockwise-routed half-turn conductor 68 and counter-clockwise-routed half-turn conductor 70 coact to cancel the well-known "half-turn effect" that would otherwise contribute to an undesirable offset voltage in Hall-effect device 28.

Of course, resistors 62 and 76 are sized, based on the power supply voltages available, to establish the Hall-effect device bias current at a value large enough to provide a suitable Hall gain-to-noise ratio and small enough to keep Hall-effect device 28 within a reasonable power dissipation limit.

In response to the bias current and magnetic flux lines 14 and 46, Hall-effect device 28 generates a signal voltage across terminals 78 and 80. In like manner to the bias current, the signal voltage divides at terminal 78 into a clockwise-routed half-turn conductor 82 and a counter-clockwise-routed half-turn conductor 84 and into respective 10 ohm resistors 86 and 88. The divided signal voltage is recombined at the interconnection of resistors 86 and 88, from which the signal voltage from terminal 78 is connected through a 392 ohm resistor 90 to the noninverting input of amplifier 36. The signal voltage at terminal 80 is connected through a 392 ohm resistor 92 to the inverting input of amplifier 36. Clockwise-routed half-turn conductor 82 and counter-clockwise-routed half-turn conductor 84 coact to cancel the half-turn effect that would otherwise contribute to an undesirable offset in the signal voltage.

An 8,250 ohm feedback resistor 93 sets the closed-loop gain of amplifier 36 at about 21. An 8,250 resistor 94 provides an adjustable offset voltage to the noninverting input of amplifier 36. The adjustable offset voltage is filtered by a 0.1 microFarad capacitor 95.

Additional gain is provided by an amplifier 96 having a closed-loop gain of about 100 set by resistors 97 and 98.

Accounting for the preferred 1:15 ratio of the reluctances of flux paths 30 and 32 and the coupling efficiencies of Hall-effect device 28 and flux diverting coils 42 and 44, the gains of amplifiers 36 and 96 are set to provide an amount of diverter current through flux diverting coils 42 and 44 that nulls out the net flux sensed by Hall-effect device 28. Hence, the amount of diverter current provided by amplifier 96 is proportional to the low-frequency component of the signal current flowing in conductor 12 (FIG. 1). The diverter current flows from flux diverting coils 42 and 44, through a 50 ohm resistor 100, to ground. The voltage developed across resistor 100 is proportional to the diverter current and is, therefore, connected to the noninverting input of a buffer amplifier 102.

Amplifiers 36 and 96 and buffer amplifier 102 are all preferably a type OP-27 manufactured by Texas Instruments of Dallas, Tex.

The above-described high-frequency component of the signal current is coupled into high-frequency coils 52 and 54 and is developed as a high-frequency voltage across a 50 ohm resistor 104. The high-frequency and low-frequency components are generated from two different coils that, therefore, require amplitude matching to ensure a flat frequency response. Accordingly, the high-frequency voltage is connected in the proper phase and magnitude to the inverting input of buffer amplifier 102 to recombine the low- and high-frequency components of the signal voltage. The output of buffer amplifier 102 is an accurate wide-bandwidth representation of the signal current flowing in conductor 12. Current probe 10 has a very low insertion impedance (especially its inductive component). Therefore, high-current square-wave shaped signal currents reproduced at the output of buffer amplifier 102 have a rise-time of only about one nanosecond, which is significantly faster than prior current probes.

FIG. 3 shows a preferred arrangement of mechanical components comprising current probe 10. Probe arm 16 and flux diverting arm 22 are formed from a single piece of 4 millimeter thick ferrite material as are probe arm 18 and flux diverting arm 24. The two single pieces so formed are positioned facing each other in a mirror-imaged symmetry with their major axes substantially parallel and their facing major surfaces 106 and 108 spaced-apart by about 5 millimeters.

Probe arms 16 and 18 are tapered in width toward their ends adjacent to gap 50 such that their maximum to minimum widths have a ratio of about 4:1, where the preferred maximum width is about 4 millimeters. The taper allows current probe 10 to more readily straddle conductors in tight locations.

Flux link 26 is formed as a 12 millimeter by 4 millimeter rectangular block from a single piece of 4 millimeter thick ferrite material. Flux link 26 is spaced-apart from the end surfaces of flux diverting arms 22 and 24 by a 0.25 millimeter (0.001 inch) thick shim 110 that establishes the thickness of air gaps 34. Shim 110 is formed from a dimensionally-stable non-magnetic material, such as polyamide, brass, or aluminum.

Flux shunt 20 is formed from two pieces of 4 millimeter thick ferrite material, which are referred to as a first half 20A and a second half 20B. First half 20A and second half 20B are sized to fit tightly between facing major surfaces 106 and 108 when Hall-effect device 28 (not shown) is enclosed within air gap 27. Surfaces of first half 20A and second half 20B facing air gap 27 and facing major surfaces 106 and 108 are preferably lapped to ensure a reliable path for magnetic flux flowing through flux shunt 20. Second half 20B has Hall-effect device 28 thin-film deposited thereon, and first half 20A further includes a cross-sectionally necked-down or tapered transition region 112 that acts as a flux concentrator for Hall-effect device 28. Transition region 112 terminates in a cross-sectional area that preferably matches the 1.5 millimeter by 1.5 millimeter (0.06 inch by 0.06 inch) cross-sectional dimensions of Hall-effect device 28. Flux diverting coils 42 and 44 and high-frequency coils 52 and 54 are each preferably close wound on a 5 millimeter long bobbin 114 that has a cross-section sized and shaped to fit snugly over respective flux diverting arms 22 and 24 and probe arms 16 and 18.

Because length 48 of gap 50 is open to external magnetic fields, current probe 10 preferably is shielded from such fields by an overall magnetic shield 116 that is open only in the regions of gap 50 and flux link 26, the latter opening providing electrical access for circuit 60 (not shown). Magnetic shield 116 is preferably formed from mu-metal having a permeability of at least 100,000 after annealing.

Current probe 10 and users thereof are protected from potentially hazardous electrical voltages by an insulating cover 118 that is shaped to conform to the overall dimensions of current probe 10. In particular, insulating cover 118 also protects, but leaves open, length 48 of gap 50 so that current probe 10 may safely measure currents flowing in uninsulated electrical conductors.

Referring also to FIG. 3, insulating cover 118 preferably extends beyond flux link 26 to provide an enclosure for all or part of circuit 60. The resulting proximity of circuit 60 to current probe 10 acts to enhance its high-frequency current measuring capability. This is especially true when the output of buffer amplifier 102 drives a high-frequency measurement device, such as an oscilloscope. In a preferred oscilloscope probe application, current probe 10 and amplifiers 36 and 96 and their associated components are housed within insulating cover 118 and interconnected by a flex circuit, while buffer amplifier 102 and its associated components are housed within another housing attached to the oscilloscope at the opposite end of a cable interconnecting amplifier 96 and buffer amplifier 102.

Skilled workers will recognize that portions of this invention may be implemented differently from the implementations described above for a preferred embodiment. For example, the above-described dimensions, gaps, component values, magnetic materials employed, coil turns, amplifier gains, and ratios may be scaled, modified, and reconfigured to suit a wide variety of current measuring applications. The magnetic components of current probe 10 do not require mirror-image symmetry, nor must pairs of coils be employed. In particular, flux diverting coils 42 and 44 may be implemented as a single coil that may be wound around any of flux diverting arms 22 and 24 and flux link 26. Also, the magnetic components may be formed from other than ferrite materials, such as stamped, preformed, laminated stacks of ferromagnetic plates. And of course, circuit 60 need not be implemented at opposite ends of a probe cable, but may be combined at either end and interconnected by any combination of a flex circuit, etched circuit board, integrated circuit, hybrid circuit, and discrete wiring.

It will be obvious to those having skill in the art that many changes may be made to the details of the above-described embodiment of this invention without departing from the underlying principles thereof. Accordingly, it will be appreciated that this invention is also applicable to current measuring applications other than those found in oscilloscope probes. The scope of the present invention should, therefore, be determined only by the following claims.

I claim:

1. An apparatus for noninvasively measuring a signal current flowing in a conductor that produces a magnetic signal flux proportional to the signal current, comprising:
   a pair of spaced-apart probe arms for straddling and magnetically coupling to the conductor for receiving the magnetic signal flux;
   a flux shunt providing a flux shunting path between the probe arms so that a first portion of the magnetic signal flux flows through the flux shunt;
   a magnetic flux sensor coupled to the flux shunt for sensing the first portion of the magnetic signal flux;
   a flux diverting path magnetically coupled to the probe arms and the flux shunt for diverting a second portion of the magnetic signal flux away from the flux shunt; and
   an amplifier electrically coupled to the magnetic flux sensor for driving a diverter current through a diverter coil that is magnetically coupled to the flux diverting path, the diverter current controlling the second portion of the magnetic signal flux such that the first portion of the magnetic signal flux is diverted away from the flux shunting path and into the flux diverting path, the diverter current being proportional to the signal current flowing in the conductor and, thereby, effecting a measurement of the signal current.

2. The apparatus of claim 1 in which the flux diverting path includes a pair of flux diverting arms that are magnetically coupled together through an air gap by a flux link.

3. The apparatus of claim 2 in which the diverter coil comprises a pair of coils that are wound around respective ones of the flux diverting arms.

4. The apparatus of claim 2 in which the diverter coil is wound around the flux link.

5. The apparatus of claim 1 in which the flux shunt further includes an air gap and the magnetic flux sensor is a Hall-effect device that is enclosed within the air gap in the flux shunt.

6. The apparatus of claim 5 in which the flux shunt comprises first and second portions positioned on opposite sides of the air gap.

7. The apparatus of claim 6 in which the Hall-effect device has a cross-sectional area and the first portion of the flux shunt further includes a transition region that terminates in a surface having an area that substantially matches the cross-sectional area of the Hall-effect device.

8. The apparatus of claim 6 in which the first and second portions of the flux shunt have lapped facing surfaces on opposing sides of the air gap.

9. The apparatus of claim 1 in which the spaced-apart pair of probe arms have ends opposite the flux shunt, and each probe arm is tapered in a width that decreases toward the ends.

10. The apparatus of claim 9 in which a ratio of the width of the probe arms at the flux shunt to the width of the probe arms at the ends is about 4:1.

11. The apparatus of claim 9 in which the spaced-apart pair of probe arms form a gap therebetween that has a length extending substantially from the ends toward the flux shunt.

12. The apparatus of claim 11 in which a ratio of a dimension of the length to a dimension of the gap is about 6:1.

13. The apparatus of claim 1 in which the flux shunting path has a first reluctance dominated by a first air gap and the flux diverting path has a second reluctance dominated by a second air gap.

14. The apparatus of claim 13 in which a ratio of the first reluctance to the second reluctance is about 1:15.

15. The apparatus of claim 13 in which the first and second air gaps have respective first and second dimensions and a ratio of the first and second dimensions is about 1:15.

16. The apparatus of claim 1 in which the probe arms, the flux shunt, and the flux diverting path are formed from a ferrite material having a permeability of at least about 3,000.

17. The apparatus of claim 1 further including a high-frequency coil magnetically coupled to at least one of the probe arms and in which the signal current includes a high-frequency component, the high-frequency coil coupling a predetermined portion of the high-frequency component to the amplifier to effect a high-frequency measurement of the signal current.

18. The apparatus of claim 1 in which the spaced-apart pair of probe arms form a gap therebetween and in which the probe arms, the flux shunt, and the flux diverting path are substantially enclosed by a magnetic shield that has an opening exposing the gap.

19. The apparatus of claim 18 in which the magnetic shield is formed from mu-metal having a permeability of at least about 100,000.

20. The apparatus of claim 18 in which the magnetic shield and the gap are substantially enclosed by an electrically insulating cover.

21. A method of noninvasively measuring a signal current flowing in a conductor that produces a magnetic signal flux proportional to the signal current, comprising:
   straddling the conductor with a pair of spaced-apart probe arms that are magnetically coupled to the conductor to receive the magnetic signal flux;
   shunting a first portion of the magnetic signal flux through a flux shunting path between the probe arms;
   diverting with a diverting flux a second portion of the magnetic signal flux through a flux diverting path and away from the flux shunting path; and measuring an amount of the diverting flux required to divert substantially all of the first portion of the magnetic signal flux into the flux diverting path to effect a measurement of the signal current.

22. The method of claim 21 further including sensing the first portion of the magnetic signal flux flowing in the flux shunting path.

23. The method of claim 22 in which the diverting step further includes coupling a diverter coil to the flux diverting path and driving the diverter coil with a diverting current responsive to the sensing step.

24. The method of claim 21 in which the spaced-apart pair of probe arms have ends opposite the flux shunting path and the straddling step further includes tapering each probe arm in a width that decreases toward the ends.

25. The method of claim 21 in which the signal current includes a high-frequency component and the method further includes coupling a predetermined portion of the high-frequency component from at least one of the probe arms into the measuring step to effect a high-frequency measurement of the signal current.

26. The method of claim 21 in which the spaced-apart pair of probe arms form a gap therebetween and the method further includes providing a magnetic shield that substantially encloses the probe arms, the flux shunt, and the flux diverting path, and providing an opening in the magnetic shield that exposes the gap.

27. The method of claim 26 further including enclosing the magnetic shield and the gap in an electrically insulating cover.

* * * * *